United States Patent
Okawara (10) Patent No.: US 10,103,332 B2
(45) Date of Patent: Oct. 16, 2018

(54) EVAPORATION MASK AND MANUFACTURING METHOD OF ORGANIC EL DISPLAY

(71) Applicant: Japan Display Inc., Minato-ku (JP)

(72) Inventor: Takeshi Okawara, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/353,011

(22) Filed: Nov. 16, 2016

(65) Prior Publication Data

US 2017/0244036 A1  Aug. 24, 2017

(30) Foreign Application Priority Data

Feb. 23, 2016  (JP) .................. 2016-032014

(51) Int. Cl.
*H01L 51/56*    (2006.01)
*H01L 51/00*    (2006.01)
*C23C 14/04*    (2006.01)

(52) U.S. Cl.
CPC ...... *H01L 51/0012* (2013.01); *H01L 51/0011* (2013.01); *H01L 51/56* (2013.01); *C23C 14/042* (2013.01)

(58) Field of Classification Search
CPC . H01L 51/0012; H01L 51/56; H01L 51/0011; C23C 14/04; C23C 14/042; C23C 14/044
See application file for complete search history.

(56) References Cited

U.S. PATENT DOCUMENTS

| | | | | |
|---|---|---|---|---|
| 6,459,193 B1 * | 10/2002 | Fukuzawa | ............. | C23C 14/042 313/402 |
| 6,852,356 B2 * | 2/2005 | Nishikawa | ............ | C23C 14/042 118/721 |
| 7,282,240 B1 * | 10/2007 | Jackman | ................ | B82Y 10/00 427/282 |
| 7,837,528 B2 * | 11/2010 | Shigemura | ............ | C23C 14/042 118/504 |
| 9,450,185 B2 * | 9/2016 | Kang | .................... | C23C 14/042 |

(Continued)

FOREIGN PATENT DOCUMENTS

EP  1 207 557 A2 *  5/2002  ............. H01L 27/00
JP  2013-216978  10/2013

(Continued)

OTHER PUBLICATIONS

Fabrication of an Evaporation Mask; IBM Technical Disclosure Bulletin; May 1, 1971; p. 3654.*

(Continued)

*Primary Examiner* — Mary Wilczewski
(74) *Attorney, Agent, or Firm* — Oblon, McClelland, Maier & Neustadt, L.L.P.

(57) ABSTRACT

A method of manufacturing an evaporation mask, includes preparing a semi-finished body of an evaporation mask including a reinforcing bar and a film having an area larger than an area of the reinforcing bar, forming an opening pattern in a region, which is prevented from planarly overlapping with the reinforcing bar, of the film, and forming at least one projecting portion in a region, which is on a surface opposite to the reinforcing bar and which planarly overlaps with the reinforcing bar, of the film.

3 Claims, 10 Drawing Sheets

(56) References Cited

U.S. PATENT DOCUMENTS

| | | | |
|---|---|---|---|
| 2002/0076847 A1* | 6/2002 | Yamada | C23C 14/042 438/34 |
| 2002/0125824 A1* | 9/2002 | Fukuzawa | C23C 14/042 313/640 |
| 2003/0044517 A1* | 3/2003 | Nishikawa | C23C 14/044 427/66 |
| 2003/0180474 A1* | 9/2003 | Nishikawa | C23C 14/042 427/468 |
| 2003/0221613 A1* | 12/2003 | Kang | C25D 1/10 118/504 |
| 2004/0104197 A1* | 6/2004 | Shigemura | C23C 14/042 216/20 |
| 2004/0142108 A1* | 7/2004 | Atobe | C23C 14/042 427/282 |
| 2006/0062978 A1* | 3/2006 | Yotsuya | H05K 3/143 428/209 |
| 2006/0081184 A1* | 4/2006 | Yeh | C23C 14/042 118/720 |
| 2006/0087226 A1* | 4/2006 | Miura | C23C 14/042 313/504 |
| 2006/0266943 A1* | 11/2006 | Phelan, Jr. | G01J 5/061 250/338.3 |
| 2007/0075312 A1* | 4/2007 | Chin | H01L 27/3209 257/40 |
| 2007/0159048 A1* | 7/2007 | Chang | H05B 33/10 313/403 |
| 2009/0253336 A1* | 10/2009 | Ito | H01L 51/56 445/58 |
| 2010/0033084 A1* | 2/2010 | Ko | H01L 27/3246 313/504 |
| 2013/0015444 A1* | 1/2013 | Hirai | C23C 14/042 257/57 |
| 2014/0020628 A1* | 1/2014 | Wang | H01L 21/02104 118/721 |
| 2014/0041587 A1* | 2/2014 | Wu | H05B 33/10 118/720 |
| 2015/0037928 A1 | 2/2015 | Hirobe et al. | |
| 2015/0251205 A1 | 9/2015 | Hirobe et al. | |
| 2016/0145762 A1* | 5/2016 | Im | C25D 1/10 438/46 |
| 2017/0033285 A1* | 2/2017 | Ruan | H01L 51/56 |
| 2017/0104186 A1* | 4/2017 | Li | H01L 51/56 |
| 2017/0198384 A1* | 7/2017 | Kobayashi | C23C 14/24 |
| 2017/0244036 A1* | 8/2017 | Okawara | H01L 51/56 |

FOREIGN PATENT DOCUMENTS

| | | | | |
|---|---|---|---|---|
| JP | 2013-241667 | | 12/2013 | |
| JP | 2013-245392 | | 12/2013 | |
| KR | 2002-028623 | * | 4/2002 | H01L 31/12 |
| KR | 10-0704688 | * | 4/2007 | H05B 33/10 |
| WO | WO 2017/032248 | * | 3/2017 | C23C 14/04 |

OTHER PUBLICATIONS

Evaporation Mask; IBM Technical Disclosure Bulletin; Nov. 1, 1976, p. 2223.*

* cited by examiner

EVAPORATION MASK AND MANUFACTURING METHOD OF ORGANIC EL DISPLAY

CROSS-REFERENCE TO RELATED APPLICATION

The present application claims priority from the Japanese Application JP 2016-032014 filed on Feb. 23, 2016. The Japanese Application JP 2016-032014 is incorporated by reference into this application.

BACKGROUND OF THE INVENTION

1. Field of the Invention

The present invention relates to a method of manufacturing an evaporation mask, and a method of manufacturing an organic EL display.

2. Description of the Related Art

An evaporation mask is disclosed in Japanese Patent Application Laid-open No. 2013-216978. The evaporation mask is formed by laminating a metal mask having slits formed therein, and a resin mask which is arranged on a surface of the metal mask and has opening portions formed therein, which correspond to a pattern to be formed through deposition and are horizontally and vertically arranged in a plurality of rows.

SUMMARY OF THE INVENTION

Meanwhile, in manufacturing steps of an organic EL display, when the evaporation mask as described above is used to deposit an organic film onto a pixel portion of an array substrate, there is a fear that the deposited organic film may come into contact with the evaporation mask, to be thereby damaged. Therefore, a spacer for preventing such contact is arranged on an array substrate side in some cases.

However, when the array substrate and the evaporation mask become misaligned or the like, there is a fear that the spacer arranged on the array substrate side may come into contact with a portion between the metal mask and the opening portions, which is formed of only the resin mask, with the result that the resin mask is damaged and unusable.

The present invention has been made in view of the above-mentioned problem, and has an object to provide a method of manufacturing an evaporation mask and a method of manufacturing an organic EL display, which are able to suppress a deformation of a film included in the evaporation mask.

A method of manufacturing an evaporation mask, includes preparing a semi-finished body of an evaporation mask including a reinforcing bar and a film having an area larger than an area of the reinforcing bar, forming an opening pattern in a region, which is prevented from planarly overlapping with the reinforcing bar, of the film, and forming at least one projecting portion in a region, which is on a surface opposite to the reinforcing bar and which planarly overlaps with the reinforcing bar, of the film.

A method of manufacturing an organic EL display, includes preparing a semi-finished body of an evaporation mask including a reinforcing bar and a film having an area larger than an area of the reinforcing bar, forming an opening pattern in a region, which is prevented from planarly overlapping with the reinforcing bar, of the film, forming at least one projecting portion in a region, which is on a surface opposite to the reinforcing bar and which planarly overlaps with the reinforcing bar, of the film, and depositing an organic material through the opening pattern.

DETAILED DESCRIPTION OF THE INVENTION

Embodiments of the present invention are described below with reference to the attached drawings. The disclosure is only exemplary, and modifications made as appropriate within the gist of the present invention that can be conceived with ease by those skilled in the art are naturally within the scope of the present invention. For clearer illustration, some widths, thicknesses, shapes, and the like of respective portions are schematically illustrated in the drawings in comparison to actual modes. However, the widths, the thicknesses, the shapes, and the like are merely an example, and do not limit understanding of the present invention. Further, like elements as those described relating to the drawings already referred to are denoted by like reference symbols herein and in each of the drawings, and detailed description thereof is sometimes omitted as appropriate.

Figure 1:
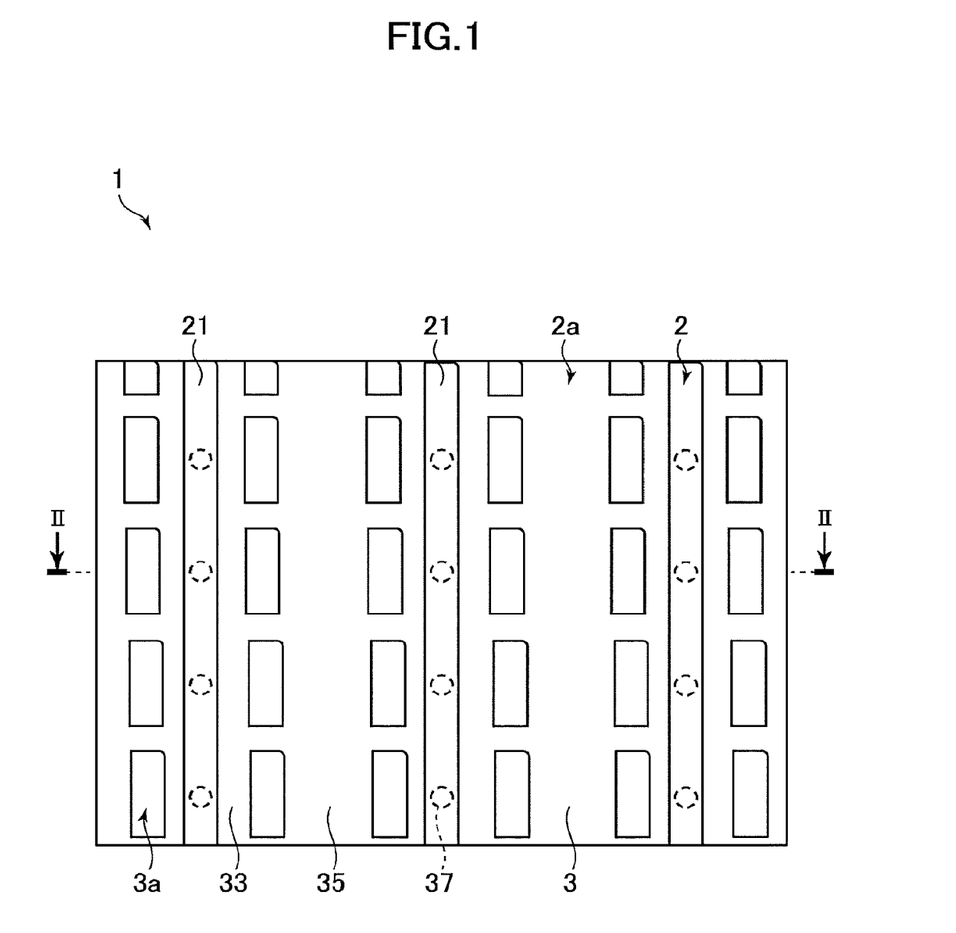
FIG. 1 is a bottom view for illustrating a first configuration example of an evaporation mask manufactured by a method of manufacturing an evaporation mask according to an embodiment of the present invention.
Figure 2:
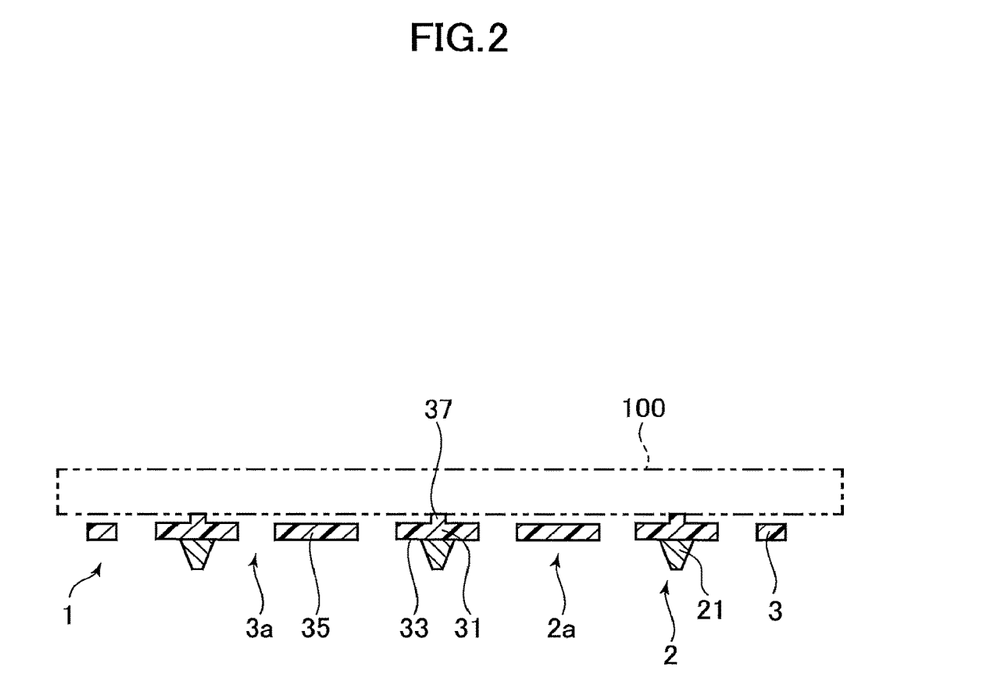
FIG. 2 is a sectional view taken along the line II-II of FIG. 1.

FIG. 1 is a bottom view for illustrating a first configuration example of an evaporation mask 1 manufactured by a method of manufacturing an evaporation mask according to an embodiment of the present invention. FIG. 2 is a sectional view taken along the line II-II of FIG. 1.

The evaporation mask 1 includes a reinforcing frame 2 and a mask 3, which are adjacent to each other in a thickness direction. In the description below, among the thickness directions of the evaporation mask 1, a direction in which the mask 3 is located in regard to the reinforcing frame 2 is referred to as "upward direction", and a direction in which the reinforcing frame 2 is located in regard to the mask 3 is referred to as "downward direction". During film formation, an array substrate 100 serving as a target is arranged in the upward direction in regard to the evaporation mask 1, that is, a direction opposite to the reinforcing frame 2 in regard to the mask 3.

The reinforcing frame 2 is arranged so as to support the mask 3. The reinforcing frame 2 is made of a metal material, for example, and is also referred to as "metal mask". Specifically, the reinforcing frame 2 is made of a magnetic metal material such as nickel, a nickel alloy, invar, or an invar alloy, for example. The reinforcing frame 2 has a thickness of from about 10 μm to about 50 μm, for example. When the reinforcing frame 2 is made of the magnetic metal material, the evaporation mask 1 can be fixed by magnetic force during film formation. The reinforcing frame 2 is not limited to being made of the metal material, and may be made of a hard resin material, for example.

The reinforcing frame 2 includes a plurality of reinforcing bars 21, which are arranged so as to be separated from each other. Between the adjacent reinforcing bars 21, there is formed a gap 2a that is formed through the reinforcing frame 2 in the upward and downward directions. The gap 2a has a rectangular shape that is long in an extending direction of the reinforcing bar 21, and has a size that can fully include a plurality of openings 3a formed in the mask 3. In the description below, the extending direction of the reinforcing bar 21 is simply referred to as "extending direction", and a width direction of the reinforcing bar 21 is simply referred to as "width direction".

The mask 3 includes an opening pattern. In the opening pattern, the plurality of openings 3a are aligned in matrix. The mask 3 is made of a resin material, for example, and is also referred to as "resin mask". Specifically, the mask 3 is made of a resin material such as polyimide or polyethylene terephthalate (PET), for example. In particular, polyimide is preferred in that polyimide has a low coefficient of linear expansion and excellent heat resistance. The mask 3 has a thickness of from about 5 μm to about 30 μm, for example.

The openings 3a are aligned such that rows each formed by arranging the openings 3a in the extending direction are arranged so as to be separated from each other in the width direction, and the reinforcing bars 21 are arranged between every other pair of the rows, for example. In other words, the openings 3a are arranged along the extending direction, and on both sides of the reinforcing bar 21 in the width direction, so as to sandwich a corresponding reinforcing bar 21, for example. The openings 3a each have a rectangular shape that is large in the extending direction, for example.

The mask 3 includes a bar forming region 31, a bar peripheral region 33, and a bar non-forming region 35 in the width direction, for example. The bar forming region 31 is a region that planarly overlaps with the reinforcing bar 21. That is, a region of the mask 3 that overlaps with the reinforcing bar 21 in planar view is the bar forming region 31. The bar peripheral region 33 is a region between the reinforcing bar 21 and the rows of the openings 3a. For example, in planar view, the bar peripheral region 33 is a set of straight lines that are formed by connecting each point of an edge of the reinforcing bar 21 to an edge of the opening 3a that is closest to that point. The bar non-forming region 35 is a region between the rows of the openings 3a, which are adjacent to each other in the width direction without sandwiching the reinforcing bar 21.

On an upper surface of the mask 3, that is, on a surface opposite to the reinforcing frame 2 in regard to the mask 3, in the bar forming region 31, which planarly overlaps with the reinforcing bar 21, a plurality of projecting portions 37 protruding in the upward direction are formed. The projecting portions 37 are configured to come into contact with the array substrate 100 serving as a target during the film formation, to thereby suppress damage of a deposited organic film caused by contact between the deposited organic film and the edge of the opening 3a of the mask 3 or the like.

Figure 10:
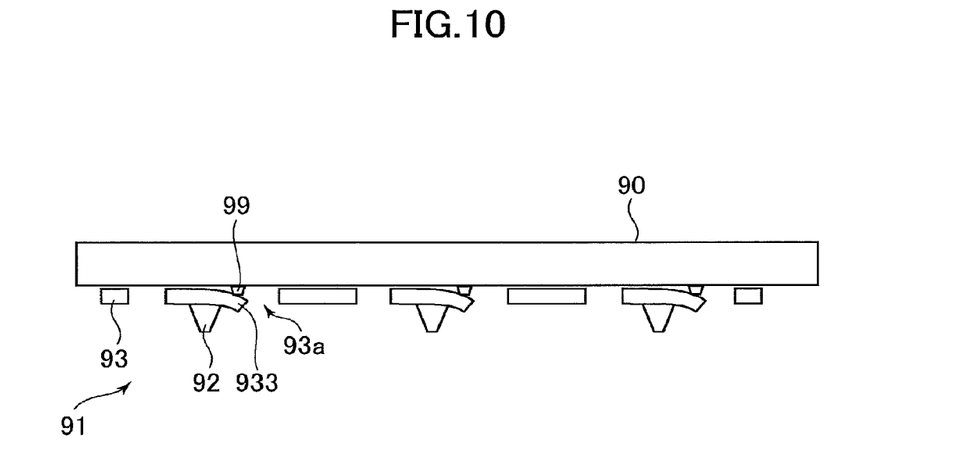
FIG. 10 is a sectional view of an evaporation mask according to a reference example.

As in a reference example illustrated in FIG. 10, in a case where a spacer 99 is arranged on an array substrate 90, there is a fear that, when the array substrate 90 and an evaporation mask 91 become misaligned, the spacer 99 may come into contact with a bar peripheral region 933 between a reinforcing bar 92 and an opening 93a of a mask 93, with the result that the mask 93 is damaged.

On the other hand, in this embodiment illustrated in FIG. 1 and FIG. 2, the projecting portion 37 is formed on the upper surface of the mask 3 and in the bar forming region 31 that planarly overlaps with the reinforcing bar 21. As a result, even when the array substrate 100 and the evaporation mask 1 become misaligned, damage of the bar peripheral region 33 of the mask 3 can be suppressed.

The projecting portions 37 are formed to have disc shapes with a diameter smaller than a width of the reinforcing bar 21, and are arranged in the extending direction at regular intervals, for example. The projecting portion 37 has a height of from about 2 μm to about 4 μm, for example. The diameter of the projecting portion 37 may be smaller than a width of the opening 3a or a width of the bar peripheral region 33, for example. Further, the projecting portion 37 is not limited to having a disc shape, and may have a rectangular shape, for example. Each projecting portion 37 is formed between the openings 3a, which are adjacent to each other in the width direction so as to sandwich the reinforcing bar 21, for example. For example, a position of the projecting portion 37 in the extending direction is aligned with a center of the opening 3a in the extending direction.

FIG. 3A, FIG. 3B, FIG. 3C, and FIG. 3D are views for illustrating example steps of the method of manufacturing an evaporation mask according to the embodiment of the present invention.

Figure 3A:
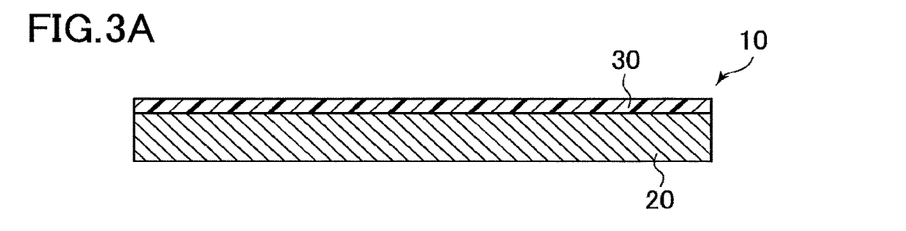
FIG. 3A, FIG. 3B, FIG. 3C, and FIG. 3D are views for illustrating example steps of the method of manufacturing an evaporation mask according to the embodiment of the present invention.

First, in Step (a), a laminate 10 including a reinforcement plate 20 and a film 30 is prepared. Specifically, a resin solution is applied onto a surface of the reinforcement plate 20, which is made of a magnetic metal material such as nickel, a nickel alloy, invar, or an invar alloy, for example, and which has a thickness of from about 10 μm to about 50 μm, for example. Then, the resin solution is dried at a temperature of from about 200° C. to about 300° C. As a result, the film 30 including a resin material such as polyimide or polyethylene terephthalate (PET), and which has a thickness of from about 5 μm to about 30 μm, for example, is formed.

Figure 3B:
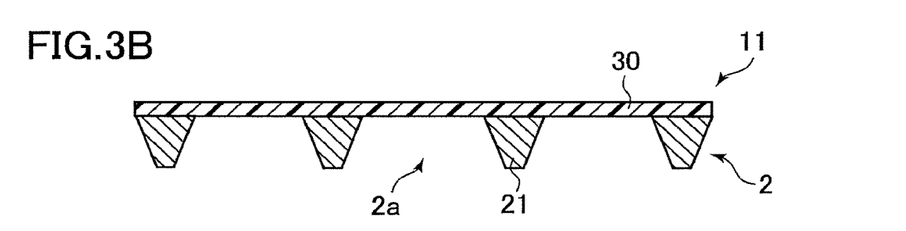

Next, in Step (b), by selectively removing the reinforcement plate 20 of the laminate 10, the reinforcing frame 2 including the reinforcing bars 21 is formed. That is, a semi-finished body 11 including the reinforcing bars 21 and the film 30 is prepared. By selectively removing the reinforcement plate 20 to form the reinforcing bars 21 and the gap 2a, an area of the film 30 becomes larger than an area of the reinforcing bars 21. When the reinforcement plate 20 is selectively removed to form the reinforcing bars 21 and the gap 2a, an alignment mark used for alignment may be formed simultaneously.

Specifically, in Step (b), the reinforcing bars 21 and the gap 2a are formed by patterning the reinforcement plate 20 of the laminate 10 by photo-etching. The present invention is not limited thereto. For example, a seed layer may be formed on a surface of the film 30 by electroless plating and photo-etching, and then the reinforcing bars 21 may be formed by plating.

Figure 3C:
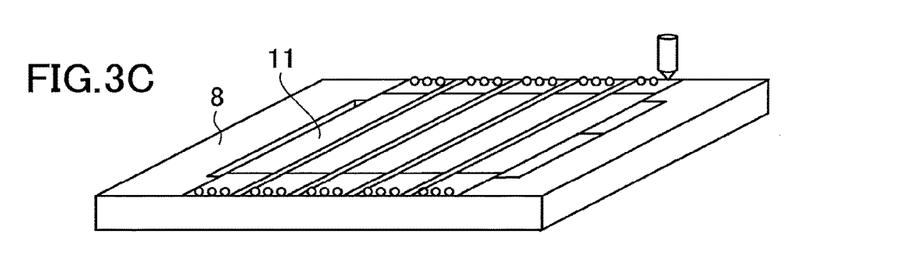

Next, in Step (c), the semi-finished body 11 is fixed to the frame 8. The frame 8 is made of a magnetic metal material, for example. Specifically, end portions of the semi-finished body 11 are placed on the frame 8. Then, under a state in which the semi-finished body 11 is bridged over a hollow area of the frame 8, the end portions of the semi-finished body 11 are fixed to the frame 8 through use of spot welding.

Figure 3D:
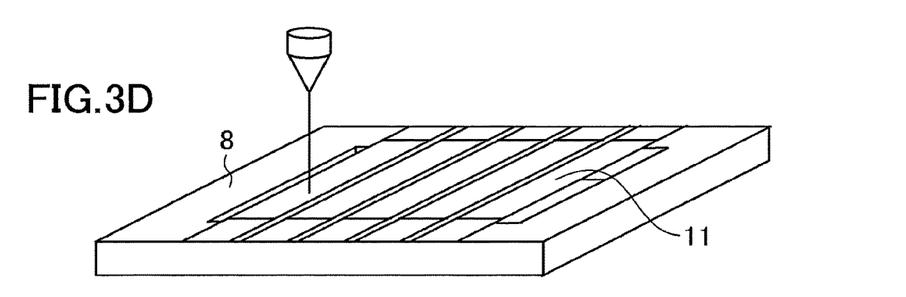

Next, in Step (d), the film 30 of the semi-finished body 11 is irradiated with laser light such that the openings 3a and the projecting portions 37 are each formed. That is, the openings 3a and the projecting portions 37 are each formed on the film 30, to thereby obtain the mask 3. As a result, the evaporation mask 1 including the reinforcing frame 2 and the mask 3 is obtained.

Here, ablation is performed to the film 30, through use of a laser light having a wave length of 400 nm or shorter, for example. A head for irradiating the laser light is configured to be movable in an in-plane direction in regard to the semi-finished body 11. The head is moved to a designated position based on the alignment mark, and irradiates the laser light onto the film 30, for example. Further, the head configured to irradiate the laser light is provided with a beam shaping mask for forming the opening 3a or the projecting portion 37.

Step (d) includes a step of forming the projecting portion 37 and a step of forming the opening 3a. As described below, either of the steps may be performed first.

Figure 4:
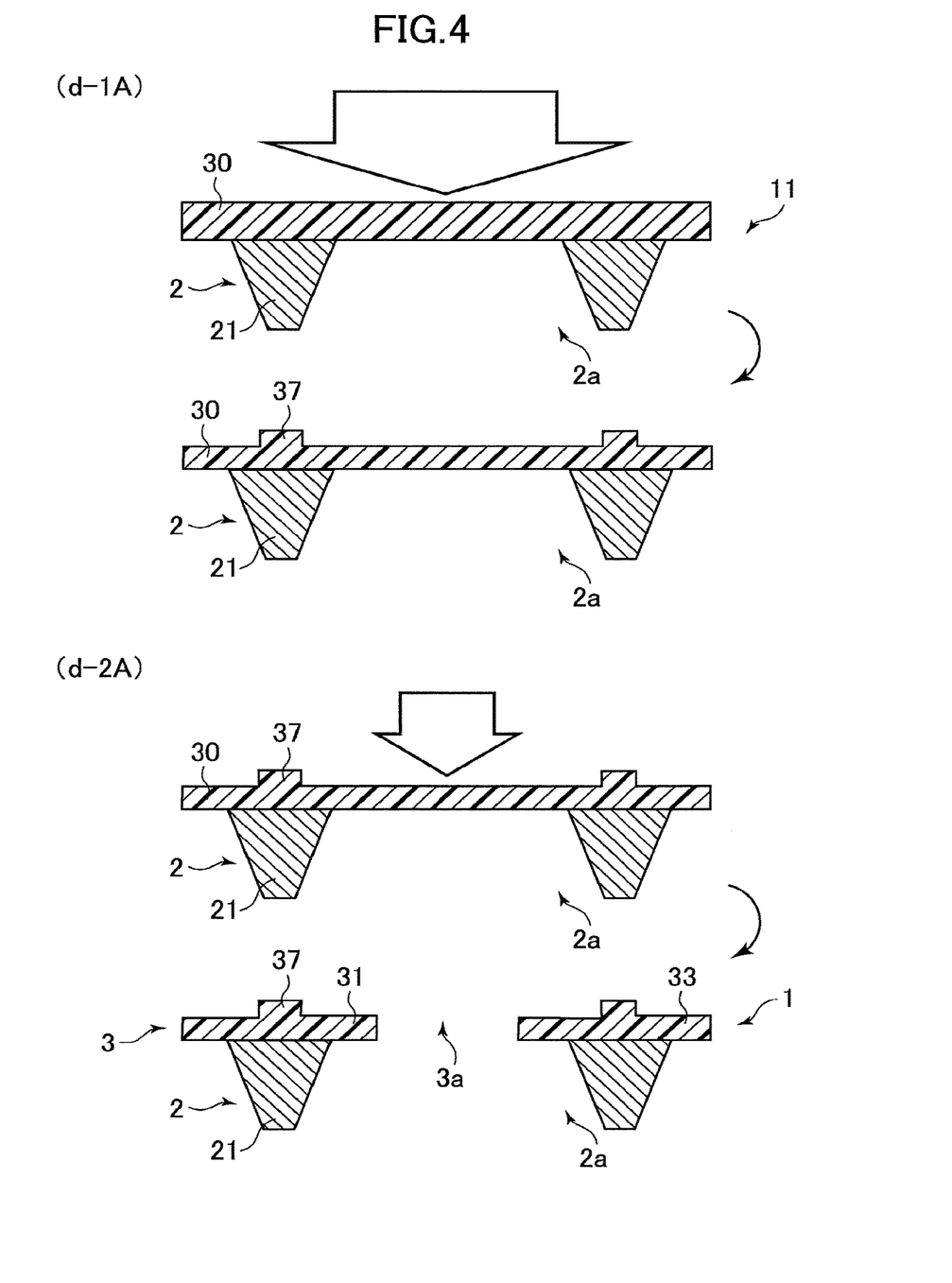
FIG. 4 is a view for illustrating a first example of a main part included in the example steps described above.

In a first example of Step (d) illustrated in FIG. 4, Step (d-1A) of forming the projecting portion 37 is performed first, and then Step (d-2A) of forming the opening 3a is performed.

First, in Step (d-1A), the projecting portion 37 is formed in a region, which is on an upper surface of the film 30, that is, on a surface opposite to the reinforcing bar 21 in regard to the film 30, and which planarly overlaps with the reinforcing bar 21 (the bar forming region 31 in FIG. 1 and FIG. 2). The laser light is irradiated toward the upper surface of the film 30 from a position above the semi-finished body 11. An output power of the laser light is adjusted to be about an amount that enables a part of the film 30 in the thickness direction to be removed, specifically, about an amount that makes the projecting portion 37 have a height of from about 2 μm to about 4 μm, for example. As a result, an output power of the laser light during the formation of the projecting portion 37 is lower than an output power of the laser light during the formation of the opening 3a.

Next, in Step (d-2A), the pattern of the opening 3a is formed in a region of the film 30 that does not planarly overlap with the reinforcing bar 21. As in the step described above, the laser light is irradiated toward the upper surface of the film 30 from the position above the semi-finished body 11. The output power of the laser light is adjusted to be about an amount that enables the laser light to penetrate through the film 30 in the thickness direction. Therefore, the output power of the laser light during the formation of the opening 3a is higher than the output power of the laser light during the formation of the projecting portion 37. Further, the laser light during the formation of the opening 3a is more condensed than the laser light during the formation of the projecting portion 37. As a result, the evaporation mask 1 is completed.

When a plurality of regions of the semi-finished body 11 are irradiated with the laser light, Step (d-1A) may be performed for all of the regions, and then Step (d-2A) may be performed for all of the regions. In this way, trouble in adjusting the output power of the laser light and replacing the beam shaping mask may be reduced. The present invention is not limited thereto. An operation of performing Step (d-1A) for one region and then performing Step (d-2A) for that region maybe conducted for all of the regions one by one.

Figure 5:
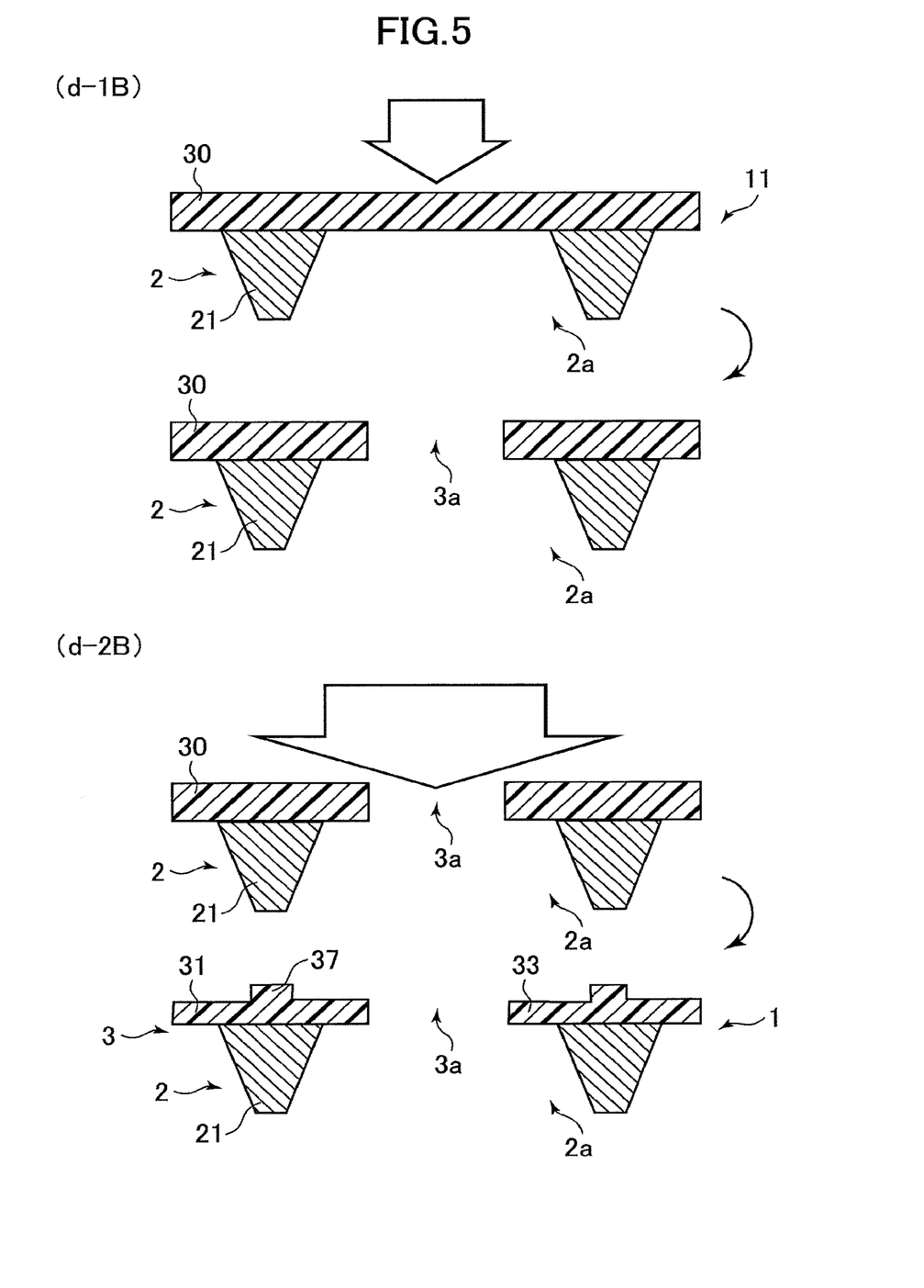
FIG. 5 is a view for illustrating a second example of a main part included in the example steps described above.

In a second example of Step (d) illustrated in FIG. 5, Step (d-1B) of forming the opening 3a is performed first, and then Step (d-2B) of forming the projecting portion 37 is performed. In the second example, those two steps are only reversed in order from the first example described above, and methods and conditions of the formation of the opening 3a or the projecting portion 37 and the like are similar to the first example described above.

Figure 6:
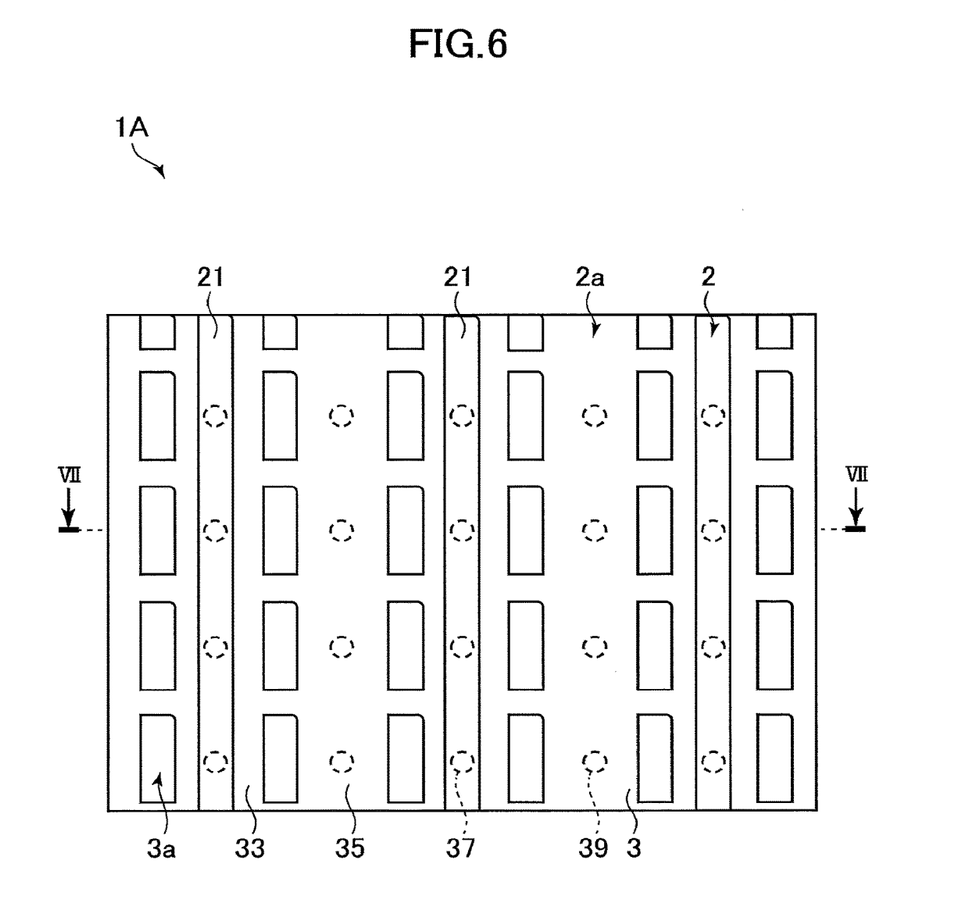
FIG. 6 is a bottom view of a second configuration example of the evaporation mask.
Figure 7:
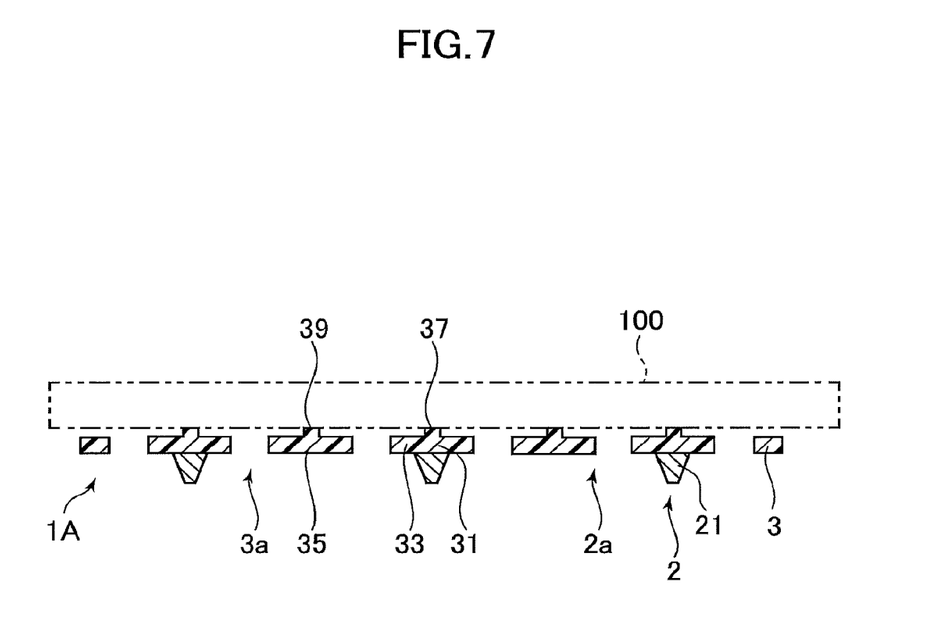
FIG. 7 is a sectional view taken along the line VII-VII of FIG. 6.

FIG. 6 is a bottom view of a second configuration example of the evaporation mask. FIG. 7 is a sectional view taken along the line VII-VII of FIG. 6. In the second configuration example, a plurality of projecting portions 39 that protrude in the same upward direction as the projecting portions 37 are also formed in the bar non-forming region 35. The bar non-forming region 35 is a region, which is on the upper surface of the mask 3, that is, on the surface opposite to the reinforcing frame 2 in regard to the mask 3, and is between the rows of the openings 3a, which are adjacent to each other in the width direction without sandwiching the reinforcing bar 21. The projecting portion 39 is formed at the same time as the projecting portion 37 in Step (d) described above.

The projecting portions 39 each have a shape and a height similar to those of each of the projecting portions 37 and are arranged in the bar non-forming region 35 in the extending direction at regular intervals, for example. The projecting portions 39 are each formed between the openings 3a, which are adjacent to each other in the width direction without sandwiching the reinforcing bar 21, for example. For example, a position of the projecting portion 39 in the extending direction is aligned with a position of the projecting portion 37 in the extending direction. The projecting portion 39 may be formed to be lower in height than the projecting portion 37, such that the projecting portion 39 serves as an auxiliary spacer configured to come into contact with the array substrate 100 when the mask 3 warps in the upward direction.

Figure 8:
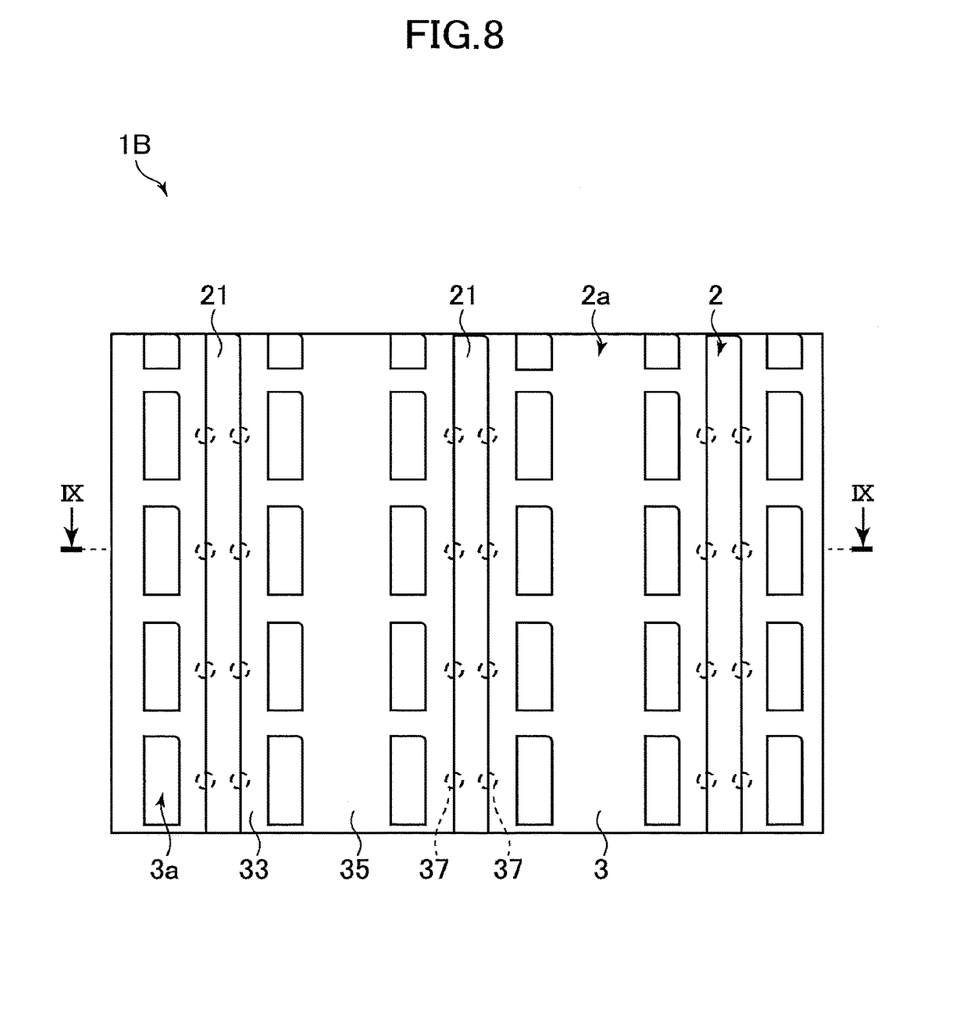
FIG. 8 is a bottom view of a third configuration example of the evaporation mask.
Figure 9:
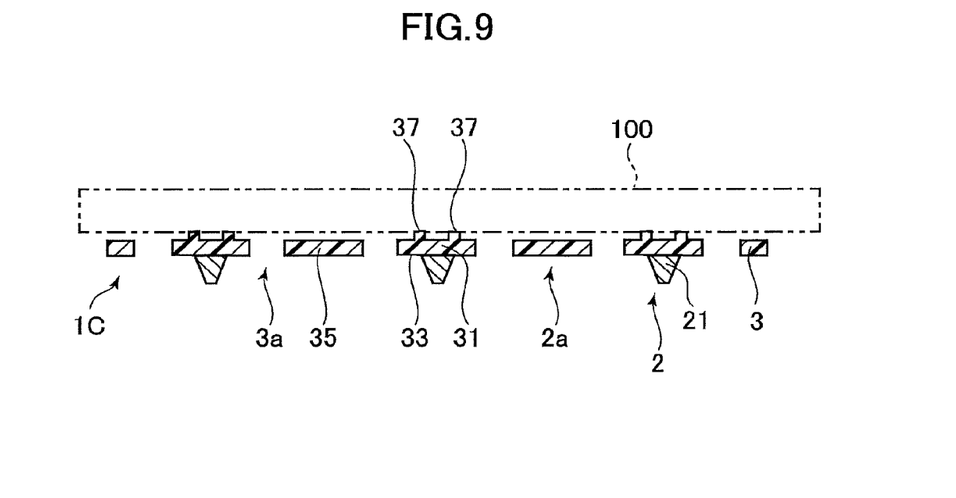
FIG. 9 is a sectional view taken along the line IX-IX of FIG. 8.

FIG. 8 is a bottom view of a third configuration example of the evaporation mask. FIG. 9 is a sectional view taken along the line IX-IX of FIG. 8. In the third configuration example, the projecting portion 37 is formed such that only a part of the projecting portion 37 planarly overlaps with the reinforcing bar 21. That is, only a part of the projecting portion 37 is included in the bar forming region 31, and a remaining part is included in the bar peripheral region 33. Specifically, a pair of the projecting portions 37, which are separated from each other in the width direction, is arranged such that each projecting portion 37 of the pair of the projecting portions 37 exceeds each edge of the reinforcing bar 21.

At least apart of the projecting portion 37 planarly overlaps with the reinforcing bar 21. Therefore, as in the first configuration example, damage of the bar peripheral region 33 of the mask 3 may be suppressed. That is, a position at which the mask 3 receives a force in the upward direction from the reinforcing bar 21, and a position at which the mask 3 receives a force in the downward direction from the projecting portion 37 are not separated in the width direction. As a result, bending of the bar peripheral region 33 may be suppressed.

Figure 11:
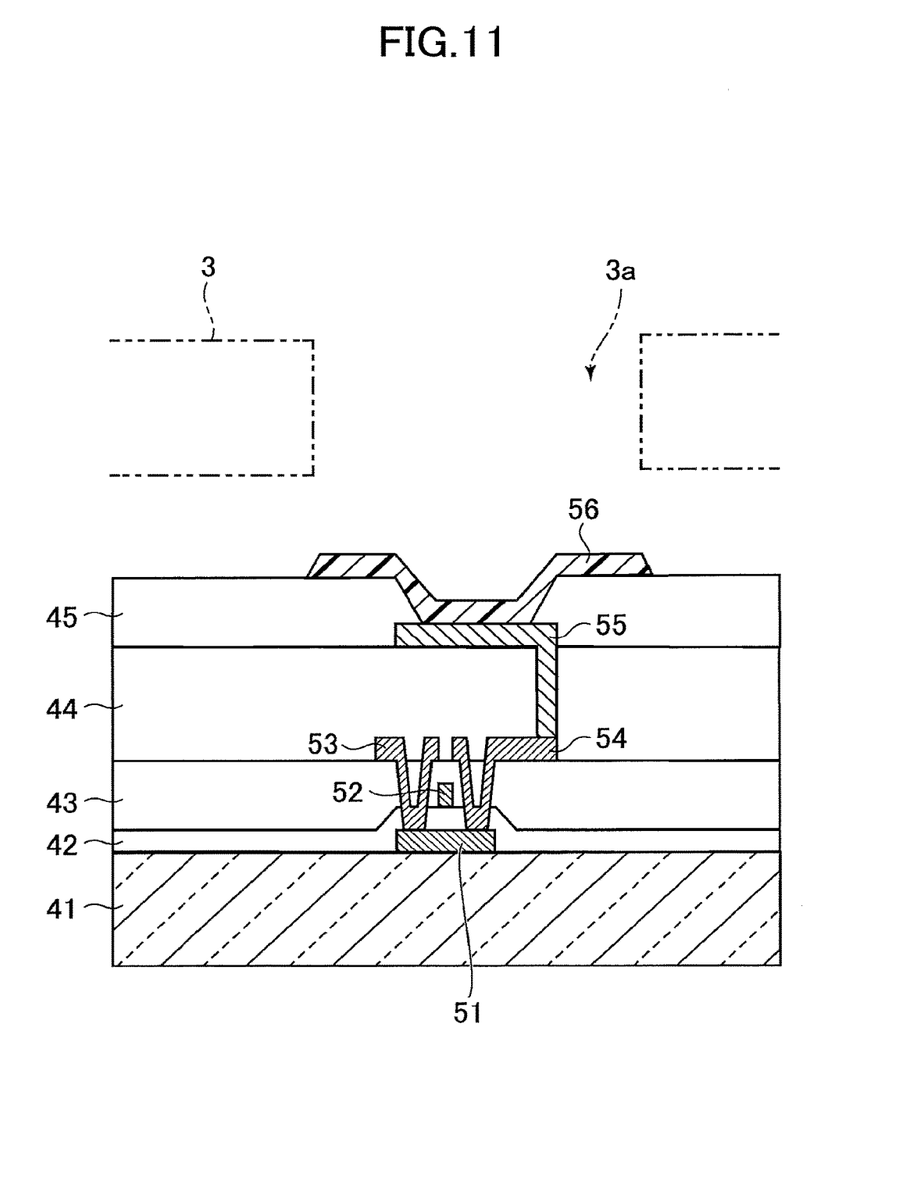
FIG. 11 is a view for illustrating an example step of a method of manufacturing an organic EL display according to an embodiment of the present invention.

FIG. 11 is a view for illustrating an example step of a method of manufacturing an organic EL display according to an embodiment of the present invention. In FIG. 11, a sectional structure for one pixel is illustrated. After the evaporation mask 1 is completed in Step (d), there is performed a step of depositing an organic material onto the array substrate 100 through use of the pattern of the opening 3a formed in the evaporation mask 1.

In the array substrate 100, a semiconductor film 51 is provided on a substrate 41, and the substrate 41 and the semiconductor film 51 are covered with an interlayer insulating film 42. A gate electrode 52 is arranged on the interlayer insulating film 42, and the interlayer insulating film 42 and the gate electrode 52 are with an interlayer insulating film 43. A source electrode 53 and a drain electrode 54 are arranged on the interlayer insulating film 43. Through holes for connecting the source electrode 53 and the drain electrode 54 to the semiconductor film 51 are formed in the interlayer insulating films 42 and 43. The semiconductor film 51, the gate electrode 52, the source electrode 53, and the drain electrode 54 described above form a TFT of a pixel circuit. The gate electrode 52 is connected to a scanning line (not shown), and the source electrode 53 is connected to a signal line (not shown). The substrate 41 is made of, for example, glass or a resin having flexibility, e.g., polyimide. The semiconductor film 51 is made of, for example, an LTPS semiconductor, an amorphous semiconductor, or an oxide semiconductor. The interlayer insulating films 42 and 43 are each an inorganic insulating film made of, for example, an inorganic material, such as silicon oxide or silicon nitride. The gate electrode 52, the source electrode 53, and the drain electrode 54 are each made of, for example, a metal, such as aluminum, silver, copper, nickel, or titanium.

The interlayer insulating film 43, the source electrode 53, and the drain electrode 54 are covered with an organic planarization film 44, and a pixel electrode 55 is arranged on the organic planarization film 44. In the organic planarization film 44, a through hole for connecting the pixel electrode 55 to the drain electrode 54 is formed. The organic planarization film 44 is, for example, an organic insulating film including an organic material, e.g., an acrylic resin, and is formed to be thicker than other interlayer insulating films. Further, the organic planarization film 44 has a flat upper surface. The pixel electrodes 55 are, for example, anodes and are arranged in matrix so as to correspond to the respective pixels. The pixel electrode 55 is made of a metal such as aluminum, silver, copper, nickel, or titanium, and has a reflective surface, for example. The organic planarization film 44 and the pixel electrode 55 are covered with a pixel isolating film 45. The pixel isolating film 45 is formed with an opening for exposing a part of the pixel electrode 55, which is a part other than edges of the pixel electrode 55. Specifically, the pixel isolating film 45 is configured to cover only a peripheral edge portion of the pixel electrode 55 around its whole circumference, and expose a central portion of the pixel electrode 55, which is on an inner side of the peripheral edge portion of the pixel electrode 55. An inner edge portion, which forms the opening of the pixel isolating film 45, has a gently-tapered shape. For example, the pixel isolating film 45 is an organic insulating film including an organic material, e.g., an acrylic resin, and is also referred to as "bank" or "rib".

A step of depositing the organic material through use of the evaporation mask 1 described above is performed when an organic film 56 is formed on the pixel electrode 55, which is exposed in the opening formed in the pixel isolating film 45. The opening 3a formed in the mask 3 of the evaporation mask 1 corresponds to the pixel electrode 55. The organic material passing through the opening 3a adheres to an inside of the opening formed in the pixel isolating film 45, and to a periphery thereof. As a result, the organic film 56 is formed.

The organic film 56 includes a light-emitting layer. The organic film 56 includes, in order from a pixel electrode 55 side, a hole-injecting layer, a hole-transporting layer, the light-emitting layer, an electron-transporting layer, and an electron-injecting layer, for example. The laminating structure of the organic film 56 is not limited thereto. The structure is not particularly limited to any structure as long as at least the light-emitting layer is included. Further, a color of light emitted from the light-emitting layer included in the organic film 56 is white, but the present invention is not limited thereto, and any color light may be emitted. Then, the organic film 56 is covered with an opposing electrode, which serves as a cathode and is made of a transparent conductive material such as indium tin oxide (ITO), indium zinc oxide (IZO), or the like. Further, the opposing electrode is covered with a sealing film made of an inorganic material such as silicon oxide, silicon nitride, for example. As a result, the array substrate 100 is completed.

While the embodiments of the present invention have been described above, it is to be understood that the present invention is not limited to the embodiments described above and may be subjected to various modifications by those skilled in the art.

For example, in the configuration examples described above, the projecting portion 37 is formed by reducing the thickness of a part of the film 30. However, the present invention is not limited thereto, and a projecting portion made of a different material may be formed on the upper surface of the film 30. Further, when the opening 3a is formed in the film 30, the laser light may be irradiated toward the lower surface of the film 30 from a position under the semi-finished body 11. Further, when the openings 3a or the projecting portions 37 are formed in the film 30, formation is not limited to be performed by the irradiation of the laser light, and may be performed by photo-etching, for example.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A method of manufacturing an evaporation mask, comprising:
    preparing a semi-finished body of an evaporation mask comprising:
        a reinforcing frame including a reinforcing bar; and
        a film having an area larger than an area of the reinforcing bar;
    forming an opening pattern in a region, which is prevented from planarly overlapping with the reinforcing bar, of the film; and
    forming at least one projecting portion in a region, which is on a surface opposite to the reinforcing bar, which planarly overlaps with the reinforcing bar, which protrudes in a direction in which the film is located in regard to the reinforcing frame, and which has a disc shape with a diameter smaller than a width of the reinforcing bar, of the film;

wherein the forming an opening pattern and the forming at least one projecting portion are performed by irradiating a laser light, and wherein an output power of the laser light during formation of the at least one projecting portion is lower than an output power of the laser light during formation of the opening pattern.

2. The method of manufacturing an evaporation mask according to claim 1, further comprising forming at least one projecting portion also in a region, which is on a surface opposite to the reinforcing bar and which is prevented from planarly overlapping with the reinforcing bar, of the film, the region being between a pair of openings adjacent to each other without sandwiching the reinforcing bar in the opening pattern.

3. A method of manufacturing an organic EL display, comprising:

preparing a semi-finished body of an evaporation mask comprising:
   a reinforcing frame including a reinforcing bar; and
   a film having an area larger than an area of the reinforcing bar;

forming an opening pattern in a region, which is prevented from planarly overlapping with the reinforcing bar, of the film;

forming at least one projecting portion in a region, which is on a surface opposite to the reinforcing bar, which planarly overlaps with the reinforcing bar, which protrudes in a direction in which the film is located in regard to the reinforcing frame, and which has a disc shape with a diameter smaller than a width of the reinforcing bar, of the film; and depositing an organic material through the opening pattern;

wherein the forming an opening pattern and the forming at least one projecting portion are performed by irradiating a laser light, and wherein an output power of the laser light during formation of the at least one projecting portion is lower than an output power of the laser light during formation of the opening pattern.

* * * * *